United States Patent
Oh et al.

(10) Patent No.: US 8,351,416 B2
(45) Date of Patent: Jan. 8, 2013

(54) METHOD AND A MODULE FOR RE-GENERATING ATSC-MH BROADCASTING SIGNAL, AN ATSC-MH BROADCAST RECEIVER, AND A STORAGE MEDIUM

(75) Inventors: Jung-Keun Oh, Goyang-si (KR); Suk-Jin Hong, Seoul (KR)

(73) Assignee: DTV Interactive Co., Ltd., Seoul (KR)

( * ) Notice: Subject to any disclaimer, the term of this patent is extended or adjusted under 35 U.S.C. 154(b) by 617 days.

(21) Appl. No.: 12/531,658

(22) PCT Filed: Jul. 8, 2009

(86) PCT No.: PCT/KR2009/003747
§ 371 (c)(1),
(2), (4) Date: Sep. 16, 2009

(87) PCT Pub. No.: WO2010/147255
PCT Pub. Date: Dec. 23, 2010

(65) Prior Publication Data
US 2011/0267547 A1      Nov. 3, 2011

(30) Foreign Application Priority Data
Jun. 15, 2009    (KR) .......................... 10-2009-0052797

(51) Int. Cl.
*H04J 3/06* (2006.01)
(52) U.S. Cl. ................. 370/350; 375/240.01; 375/270; 725/62
(58) Field of Classification Search .................. 370/208, 370/312, 310, 329, 350, 398, 470–474, 486, 370/535; 375/240, 240.01, 270, 295, 316; 725/32–35, 40, 62, 63, 39, 131, 120, 123, 725/134, 143; 455/3.02, 3.03, 3.05, 403, 455/15.1, 414.3
See application file for complete search history.

(56) References Cited

U.S. PATENT DOCUMENTS
2009/0052579 A1* 2/2009 Lee et al. ....................... 375/301
(Continued)

FOREIGN PATENT DOCUMENTS
KR    10-2008-0091997    10/2008

OTHER PUBLICATIONS
Broadcast Technical Research; "ATSC-MH"; 2007;103 pages.
(Continued)

*Primary Examiner* — Hassan Phillips
*Assistant Examiner* — Ajay Cattungal
(74) *Attorney, Agent, or Firm* — Lowe Hauptman Ham & Berner, LLP

(57) ABSTRACT

The present invention relates to a re-generating method and module for an ATSC-MH broadcasting signal, an ATSC-MH broadcast receiver, and a storage medium. The ATSC-MH broadcast receiver includes: a main stream data generating module for receiving an ATSC-MH RF signal, and outputting main stream data including MHE packets; an ATSC-MH broadcasting signal re-generating module for extracting the MHE packets from the main stream data generated by the main stream data generating module, thereby re-configuring data of MPH Group format after data interleaver; and a mobile stream generating module for outputting the mobile stream data from the interleaved MPH group format data re-configured by the ATSC-MH broadcasting signal re-generating module.

10 Claims, 7 Drawing Sheets

U.S. PATENT DOCUMENTS

| | | | | |
|---|---|---|---|---|
| 2009/0304065 | A1* | 12/2009 | Choi et al. | 375/232 |
| 2010/0296001 | A1* | 11/2010 | Kwon et al. | 348/723 |
| 2010/0296424 | A1* | 11/2010 | Kwon et al. | 370/310 |
| 2010/0296506 | A1* | 11/2010 | Ryu et al. | 370/350 |
| 2011/0110462 | A1* | 5/2011 | Lee et al. | 375/301 |
| 2012/0020276 | A1* | 1/2012 | Markman | 370/312 |

OTHER PUBLICATIONS

International Search Report for PCT/KR2009/003747.

Office Action dated Sep. 21, 2009, for Korean application No. 10-2009-0052797.

Doc. S4-131r11, *Candidate Standard: ATSC-M/H Standard, Part 2, RF/Transmission System Characteristics (A/153, Part 2: 2009)*, Dec. 31, 2008.

Doc. 54-130r12, *Candidate Standard: ATSC-M/H Standard, Part 1, Mobile/Handheld Digital Television System (A/153, Part 1: 2009)*, Dec. 31, 2008.

Doc. S4-131r14, *Candidate Standard: ATSC-M/H Standard, Part 2, RF/Transmission System Characteristics (A/153, Part 2: 2009)*, Apr. 9, 2009.

Korean Notice of Allowance for 10-2009-0052797.

* cited by examiner ived ATSC-
METHOD AND A MODULE FOR RE-GENERATING ATSC-MH BROADCASTING SIGNAL, AN ATSC-MH BROADCAST RECEIVER, AND A STORAGE MEDIUM

CROSS REFERENCE TO RELATED APPLICATION

This application claims the priority of Korean Patent Application No. 10-2009-0052797, filed on Jun. 15, 2009 in the KIPO (Korean Intellectual Property Office), the disclosure of which is incorporated herein in their entirety by reference. Further, this application is the National Phase application of International Application No. PCT/KR2009/003747, filed Jul. 8, 2009, which designates the United States and was published in English. Each of these applications is hereby incorporated by reference in their entirety into the present application.

TECHNICAL FIELD

The present invention relates to reconfiguration of an ATSC-MH (Advanced Television System Committee-Mobile Handheld) broadcasting signal; and, more particularly, to a re-generating method and module for an ATSC-MH broadcasting signal, an ATSC-MH broadcast receiver, and a storage medium, in which data of MPH Group format after interleaver is re-configured from main stream data generated by a conventional ATSC receiving part from the ATSC-MH broadcasting signal.

BACKGROUND ART

FIG. 1 is a conceptual view illustrating a construction of a conventional ATSC-MH (Advanced Television System Committee-Mobile Handheld) broadcast receiving system.

FIG. 2 is a conceptual view illustrating a construction of a conventional ATSC (Advanced Television System Committee) broadcast system.

Referring to FIG. 1, the conventional ATSC-MH broadcast receiving system includes a tuner 11, a demodulator 12, an equalizer 13, a known sequence detector 14, a block decoder 15, a main data processing part 20, and a mobile data processing part 30.

The tuner 11 tunes an RF signal to down-convert the RF signal to an intermediate frequency signal (IF signal), and then outputs converted signal to the demodulator 12. The demodulator 12 performs automatic gain control, carrier recovery, and timing recovery for an incoming IF signal to convert the IF signal into a base band signal, and then outputs the converted signal to the known sequence detector 14. The equalizer 13 compensates for distortion on a channel included in the demodulated signal and then outputs the result signal to the block decoder 15.

Meanwhile, in case where the incoming data corresponds to main service data having been subjected to trellis encoding alone, the block decoder 15 performs trellis decoding for the incoming data, and then inputs the result data to the main data processing part 20. In case where the incoming data corresponds to mobile data subjected to additional encoding and trellis encoding by a transmission system, the block decoder 15 performs the processes of the transmission system reversely, additional decoding, and trellis decoding for the mobile data, and then inputs the result data to the mobile data processing part 30. The mobile data after the block decoder 15 has the same data structure as MPH Group format after data interleaver of the transmission system. The mobile data is generated into mobile service data after passing through a data deformatter 21, an RS frame decoder 22, and a derandomizer 23 of the mobile data processing part.

Meanwhile, the main data passing through the block decoder 15 is generated into main service data after passing through a data de-interleaver 31, an RS decoder 32, and a data derandomizer 33, which are the same constructions as those of the conventional ATSC broadcast receiver (see FIG. 2).

In the case of the conventional ATSC broadcast system shown in FIG. 2, the ATSC broadcast receiver does not include a block decoder and a mobile data processing part, but includes a trellis decoder 51, a data de-interleaver 52, an RS decoder 53, and a data de-randomizer 55. The ATSC broadcast receiver is ready to receive an ATSC-MH broadcasting signal to generate main service data from the received ATSC-MH broadcasting signal, as in the case of the conventional ATSC broadcasting signal. Each of the by-product data generated from the main data has the same structure as that of the incoming data of the trellis encoder 61, the data interleaver 62, the RS encoder 63, and the data randomizer 65 of the transmission side, respectively.

However, the conventional ATSC broadcast receiver has problems as follows.

Though the conventional ATSC broadcast receiver 50 receives and decodes the ATSC-MH broadcasting signal comprising mobile data, it was impossible to separate the by-product mobile data before the last result of main data processing (i.e. data before the data de-randomizer) for most of the conventional ATSC receivers. This is because the main data processing part in the conventional ATSC broadcast receiver 50 has manufactured in the form of one chip semiconductor and has come into wide use. Therefore, it is impossible to be ready to receive ATSC-MH mobile broadcast through the conventional ATSC broadcast receiver 50, by adding the mobile data processing part 20 to it. Furthermore, in order to receive ATSC-MH mobile broadcast, users are required to buy a separate mobile broadcast receiver.

DISCLOSURE

Technical Problem

The present invention has been invented in order to overcome the above-described problems and it is, therefore, an object of the present invention to provide a re-generating method and module for an ATSC-MH broadcasting signal, and a storage medium, by re-configured a data of MPH Group format after data interleaver from main stream data generated by a conventional ATSC receiving part from an ATSC-MH broadcasting signal.

Further, another object of the present invention is to provide an ATSC-MH broadcast receiver which is ready to receive ATSC-MH broadcast both main service broadcast and mobile service broadcast by re-configuring a data of MPH Group format after data interleaver from main stream data generated by an conventional ATSC broadcast receiving part from an ATSC-MH signal.

Technical Solution

In accordance with another aspect of the present invention to achieve the object, there is provided an ATSC-MH broadcast receiver comprising: a main stream data generating module for receiving an ATSC-MH RF signal, and outputting main stream data including MHE packets; an ATSC-MH broadcasting signal re-generating module for extracting the MHE packets from the main stream data generated by the main stream data generating module, thereby re-configuring data of MPH Group format after data interleaver; and, a mobile stream generating module for outputting mobile stream data from the data of MPH Group format after data interleaver re-configured by the ATSC-MH broadcasting signal re-generating module.

In accordance with another aspect of the present invention to achieve the object, there is provided an ATSC-MH broadcasting signal re-generating module comprising: An ATSC-MH broadcasting signal re-generating module comprising: a slot gatheror for gathering a slot data comprising 118 consecutive MHE packets from main stream data; a modified-randomizer for modified-randomizing the 118 consecutive MHE packets; an RS encoder for RS-encoding data after the modified-randomizer; a modified-data interleaver for modified-data interleaving data after the RS encoder; a signaling data extracting means for extracting signaling data from an output buffer of the modified-data interleaver; and a group format detecting means for discriminating whether or not the 118 consecutive MHE packets are enough to be adopted according to validity or non-validity of the signaling data, and outputting data of MPH Group format after data interleaver reconfigured from the 118 consecutive MHE packets when the signaling data is valid. The signaling data extracting means extracts 276 bytes (276 data) as signaling data from first data in 53th segment from an output buffer of the modified-data interleaver.

The group format detecting means extracts TPC data from the result data which is obtained by allowing the signaling data extracted by the signaling data extracting means to pass through a PCCC decoder, and discriminates whether or not the 118 consecutive MHE packets are valid according to validity or non-validity of the signaling data.

The group format detecting means, assuming that a slot containing 118 consecutive MHE packets is an even-numbered slot, allows the 118 consecutive MHE packets to pass through the modified-randomizer, the RS encoder, and the modified-data interleaver in order, detects validity of the signaling data obtained from the output buffer of the modified-data interleaver, and then discriminates that the slot is an even-numbered slot when a detection result shows that the signaling data is valid; assuming that the slot containing the 118 consecutive MHE packets is an odd-numbered slot when the detection result shows that the signaling data is not valid, allows the 118 consecutive MHE packets to pass through the modified-randomizer, the RS encoder, and the modified-data interleaver in order again, detects validity of the signaling data obtained from an output buffer of the modified-data interleaver, and then discriminates that the corresponding slot is an odd-numbered slot when this detection result shows that the signaling data is valid; and generates an error event when the signaling data is not valid for either of the two cases.

The group format detecting means allows the signaling data extracted from either of the output buffer of the modified-data interleaver to pass through the PCCC decoder for discrimination of validity of the signaling data, and judges whether or not the MHE packets are valid according to detection or non-detection of the TPC data.

In accordance with another aspect of the present invention to achieve the object, there is provided an ATSC-MH broadcast receiver comprising a mobile service signal generating means for generating a mobile service signal by decoding the data of MPH Group format after data interleaver re-configured by one of the above-described ATSC-MH broadcasting signal re-generating modules.

In accordance with another aspect of the present invention to achieve the object, there is provided a method for re-generating an ATSC-MH broadcasting signal comprises; an MHE packet gathering step of gathering a slot data comprising 118 consecutive MHE packets from main stream data; an MHE validity judging step of, on an assumption that the slot containing the 118 consecutive MHE packets is an even-numbered slot or an odd-numbered slot, performing modified-randomization, RS-encoding, and modified-data interleaving for the 118 consecutive MHE packets, in order, to form 207-byte segment data, extracting signaling data from an output buffer that outputs the 207-byte segment data after the modified-randomization, and, judging that 118 consecutive MHE packets are valid according to validity or non-validity of the signaling data; and a group format outputting step of outputting data of MPH Group format after data interleaver which is reconfigured from each times' 118 consecutive MHE packets that are considered to be valid by a result obtained by repeatedly performing each of the two steps in order.

The MHE validity judging step comprises steps of: when the signaling data detected on the first assumption is valid, considering the first assumption to be right, and judging that the 118 consecutive MHE packets are valid; when the signaling data is not valid, performing re-assumption, and performing modified-randomization, RS-encoding, and modified-data interleaving for the 118 consecutive MHE packets, in order again, to form 207-byte segment data, and re-obtaining signaling data, and then, when the re-obtained signaling data is valid, considering the re-assumption to be right and judging that the 118 consecutive MHE packets are valid; and when the signaling data is not valid for the first assumption and the re-assumption, judging that the 118 consecutive MHE packets are not valid.

The judgment of validity or non-validity of the signaling data is performed by a step of judging whether or not TPC data is detected by performing PCCC decoding for the signaling data.

In accordance with another aspect of the present invention to achieve the object, there is provided a storage medium having a computer program embedded therein so as to perform, on a computer, respective steps of one of the above-described methods for re-generating an ATSC-MH broadcasting signal.

Advantageous Effects

The present invention makes it possible to re-configure data of MPH Group format after data interleaver from output data of the ATSC broadcast receiving module, and to view both main service broadcast and mobile broadcast even in the ATSC receiver by adding the function of re-configuring and processing data of MPH Group format after data interleaver to it. Further, the present invention makes it possible to be used for various purposes, such as measurement of broadcasting signal, by using the re-configured data of MPH Group format after interleaver.

BEST MODE

Hereinafter, a re-generating method and module for an ATSC-MH (Advanced Television System Committee-Mobile Handheld) broadcasting signal, an ATSC-MH broadcast receiver, and a storage medium in accordance with a preferred embodiment of the present invention will be described in more detail with reference to accompanying drawings.

MODE FOR INVENTION

Figure 3:
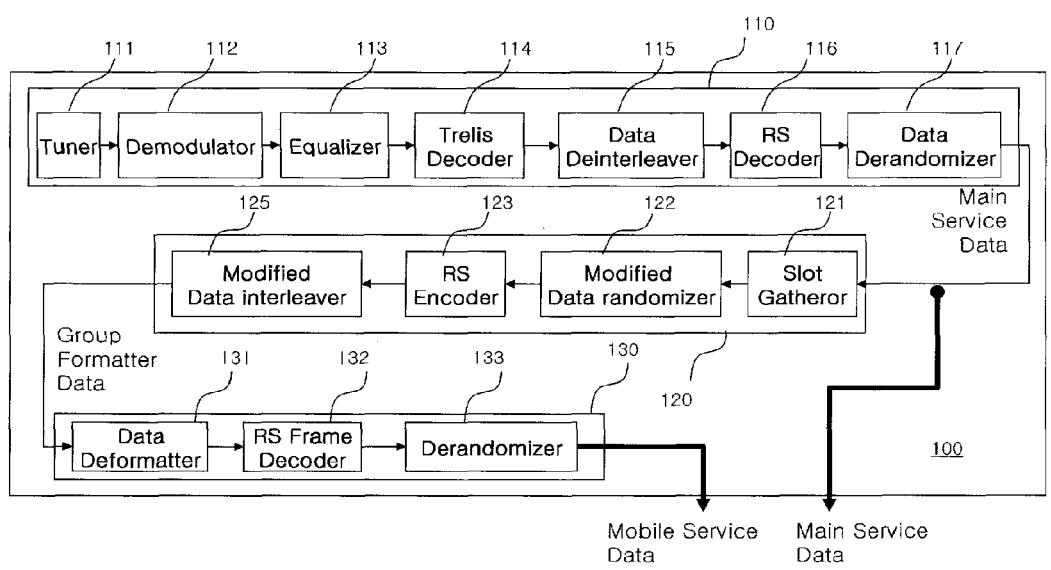
FIG. 3 is a conceptual view illustrating a construction of an ATSC-MH broadcast receiver in accordance with an embodiment of the present invention.
Figure 4:
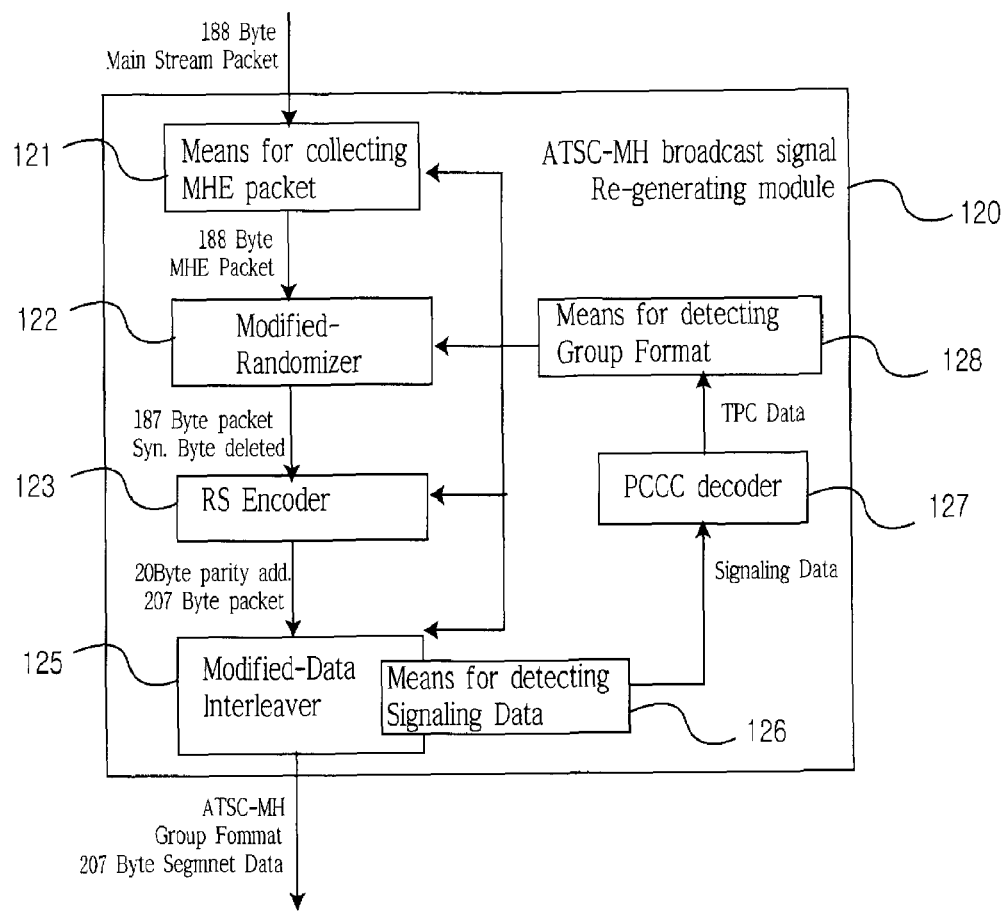
FIG. 4 is a conceptual view illustrating a construction of an ATSC-MH broadcasting signal re-generating module in accordance with the embodiment of the present invention.
Figure 5:
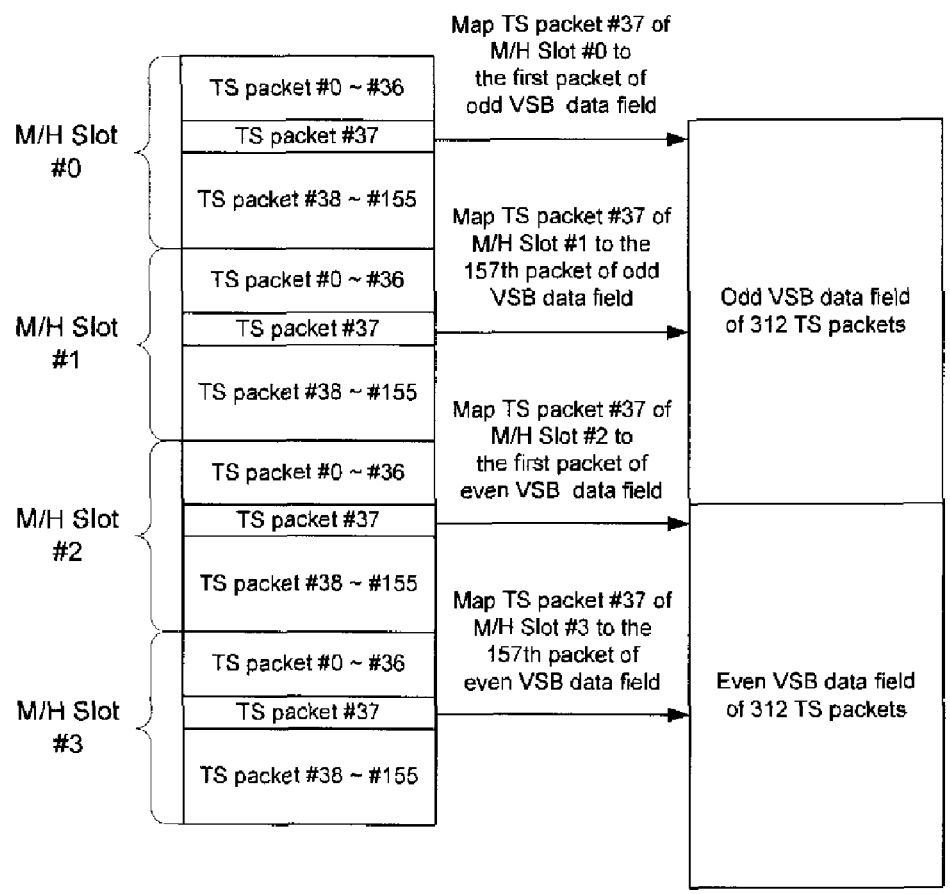
FIG. 5 is a conceptual view illustrating a state in which ATSC-MH slot data is mapped into Vestigial SideBand (VSB) fields.
Figure 6:
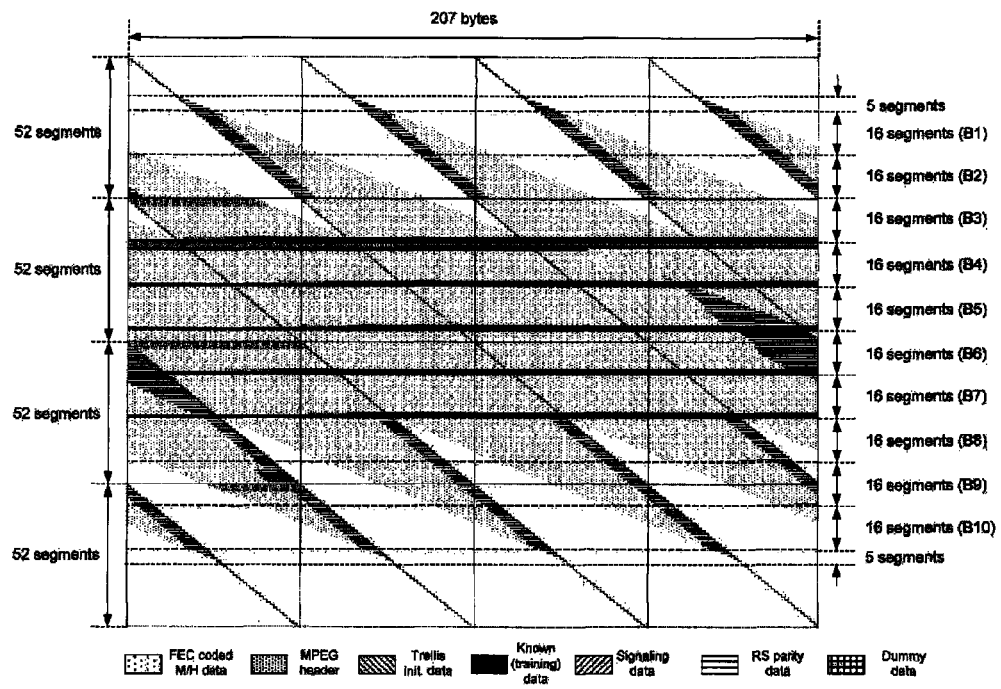
FIG. 6 are views illustrating MPH Group format after modified-data interleaver in accordance with the embodiment of the present invention.
Figure 7:
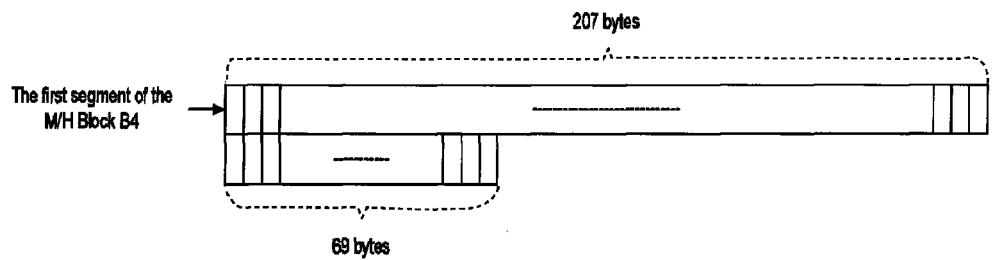
FIG. 7 are view illustrating signaling data in MPH Group format after modified-data interleaver in accordance with the embodiment of the present invention.
Figure 8:
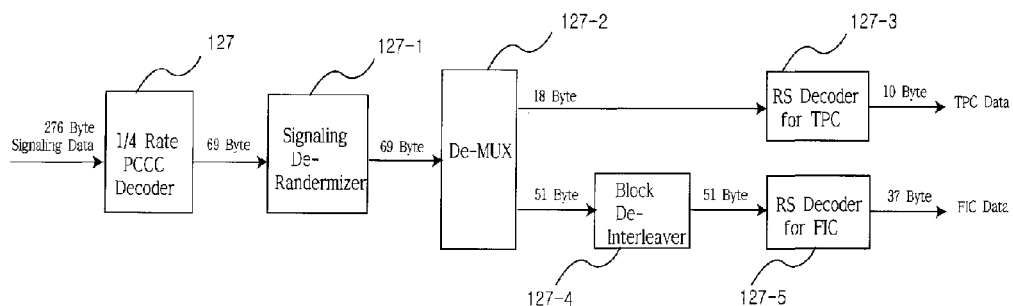
FIG. 8 is a view illustrating a process for extracting TPC data from signaling data.

FIG. 3 is a conceptual view illustrating a construction of an ATSC-MH broadcast receiver in accordance with an embodiment of the present invention, FIG. 4 is a conceptual view illustrating a construction of an ATSC-MH broadcasting signal re-generating module in accordance with the embodiment of the present invention, FIG. 5 is a conceptual view illustrating a state in which ATSC-MH slot data is mapped into Vestigial SideBand (VSB) fields, FIG. 6 are views illustrating MHE Group format after modified-data interleaver in accordance with the embodiment of the present invention, FIG. 7 are view illustrating signaling data in the MHE Group format after modified-data interleaver in accordance with the embodiment of the present invention, FIG. 8 is a view illustrating a process for extracting TPC data from signaling data.

In FIG. 3, the ATSC-MH broadcast receiver 100 in accordance with the embodiment of the present invention includes a main stream data generating module 110, an ATSC-MH broadcasting signal re-generating module 120, and a mobile stream generating module 130. The main stream data generating module 110 receives an ATSC-MH RF signal and outputs main stream data including MHE packets (M/H Encapsulation packets). The ATSC-MH broadcasting signal re-generating module 120 extracts the MHE packets from the main stream data generated from the main stream data generating module 110, thereby re-configuring data of MPH Group format after data interleaver (see ATSC S4-131r14-A153-Part-2-RF-Transmission, and Annex A-2). The mobile stream generating module 130 outputs mobile stream data from the data of MPH Group format after data interleaver that the ATSC-MH broadcasting signal re-generating module 120 re-configures.

Figure 2:
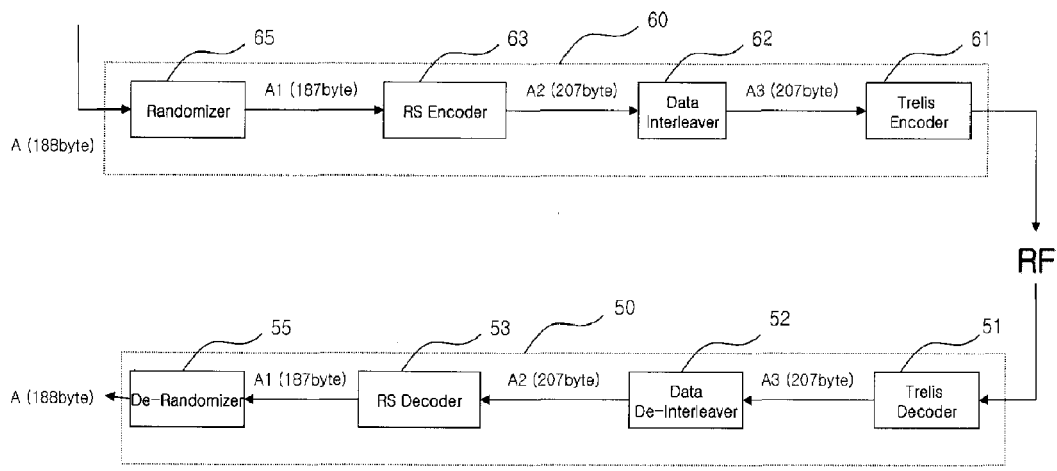
FIG. 2 is a conceptual view illustrating a construction of a conventional ATSC broadcast system.

The main stream data generating module 110 is identical with the conventional ATSC (Advanced Television System Committee) broadcast receiving module in terms of construction, but different only in the fact that it receives an ATSC-MH broadcasting signal. That is, the main stream data generating module 110 includes a tuner 111, a demodulator 112, an equalizer 113, a trellis decoder 114, a data deinterleaver 115, an RS decoder 116, and a derandomizer 117. The main stream data generating module 110 receives the ATSC-MH broadcasting signal to generate main stream data (see FIG. 2). Herein, the main stream data generated by the main stream data generating module 110 includes MHE packets, which generated through the processes identical with that of the conventional ATSC broadcast receiving module. In the embodiment of the present invention data of MPH Group format after data interleaver is re-configured from the MHE packets (see FIGS. 6 and 7).

The ATSC-MH broadcasting signal re-generating module 120 includes a slot gatheror 121, a modified-randomizer 122, an RS encoder 123, a modified-data interleaver 125, a signaling data extractor 126, and a group format detector 128.

The slot gatheror 121 gathers a slot data comprising MHE packets from the main stream data, and the modified-randomizer 122 modified-randomizes the MHE packets. The RS encoder 123 RS-encodes data after the modified-randomizer, and the modified-data interleaver 125 performs modified-data interleaving data after the RS-encoded data. The signaling data extractor 126 extracts signaling data from an output buffer of the modified-data interleaver 125, and the group format detector 128 judges whether the signaling data is valid, and then (when it is valid) outputs a data of MPH Group format after data interleaver.

The slot gatheror 121 is a means for collecting data of slot-unit (i.e. 156 packet unit) from 188-byte packet data after the derandomizer 117 in the main stream data generating module 110, by gathering 118 consecutive packets of an identical PID as MHE packets. For example, in ATSC-MH, one slot is composed of 118 MHE packets and 38 main stream data packets (tot. 156 packets, each 188-byte). Since the ATSC-MH transmission system transmits 118 MHE packets through an identical PID, and transmits 38 main stream packets through other PIDs, therefore, most likely, the 118 consecutive packets transmitted through an identical PID will be MHE packets.

Therefore, in the embodiment of the present invention, the slot gatheror 121 has to gather just 118 consecutive packets of a PID as MHE packets. If any one packet is missed, or the number of packets decreases or increases, the packets are not used as MHE packets or slot-unit data.

The modified-randomizer 122 removes one sync-byte and randomizes the other 187 bytes from each of the 188-byte 118 MHE packets gathered by the slot gatheror 121; a 187-byte data after the modified-randomizer is identical to the data after the RS decoder 116 of the main stream data generating module 110 (the modified-randomizer 122 is the same construction as that of the randomizer 65 of the conventional ATSC transmission system, however, it is different that the modified-randomizer 122 deals with MHE packets and is initialized by a slot or every 118 MHE packets).

As shown in FIG. 5, in ATSC-MH, a VSB field comprises two-slot unit data (156×2 bytes). In this case, first 37 packets of the two consecutive slots are interlaced into a preceding VSB field, i.e. first 37 MHE packets of even-numbered slots belong to the preceding VSB field and other packets belong to the consecutive VSB field.

Also, a 16-byte resister of a modified-randomizer of the conventional ATSC-MH transmission system is initialized by every one VSB field and has a value of initialization 0xF180. Since the resister changes by every input byte, the registries of the even-numbered slots and the odd-numbered slots are different from one another (i.e. the modified-randomizer registries of the first 37 MHE packets and the other 81 MHE packets of the even-numbered slots are not consecutive, because of the initialization of a modified-randomizer of the ATSC-MH transmission system). However, 118 MHE packets of the odd-numbered slots do not go through the initialization of a modified-randomizer of the ATSC-MH transmission system.

Therefore, in the embodiment of the present invention, processes for ATSC-MH data recoveries are performed under the assumption that the 118 MHE packets belong to an even-numbered slot. However, in another embodiment of the present invention, processes for ATSC-MH data recoveries may be performed under the assumption that the 118 MHE packets belong to an odd-numbered slot. In case where appropriate signaling data are detected under the above-described assumptions, the assumptions (in the case of an even-numbered slot or an odd-numbered slot) are considered to be right, then data of MPH Group format after data interleaver is output.

The RS encoder 123 performs systematic RS-encoding, adding 20 parity bytes to the 187-byte data after the modified-randomizer 122, thereby forming 207-byte packet data. In this case, the 207-byte RS-encoded data is identical to the data after the data deinterleaver 115 of the main stream data generating module 110 (the RS encoder 123 is the same construction as that of the RS encoder 63 of the conventional ATSC (or ATSC-MH) transmission system, however, it is different that the RS encoder 123 deals with MHE packets; the RS encoder 63 of the conventional ATSC (or ATSC-MH) transmission system deal only with data after a Randomizer 65).

The modified-data interleaver 125 performs modified-data interleaving for the 207-byte packet data after the systematic RS-encoding, thereby forming and outputting 207-byte 170 segment data. In this case, the 207-byte 170 segment data is identical to the data after the trellis decoder 114 of the main stream data generating module 110 (the modified-data interleaver 125 is the same construction as that of the data interleaver 62 of the conventional ATSC transmission system, however, it is different that the modified-data interleaver deals with MHE packets and is initialized by a slot or every 118 MHE packets).

In the embodiment of the present invention, when the 118 consecutive packets of one PID are valid, the modified-data interleaver 125 outputs the data after the modified-data interleaver as data of MPH Group format after data interleaver.

That is, the signaling data extractor 126 extracts 276 data (276 bytes) from first data in 53th segment, as supposedly signaling data, from an output buffer of the modified-data interleaver 125 shown in FIGS. 6 and 7, on assumption that the data after modified-data interleaver 125 is identical to the data of the MPH Group format after data interleaver. The group format detector 128 detects whether or not TPC data is extracted from the result data obtained by allowing the supposedly 276 signaling data to pass through the PCCC decoder 127. When the TPC data is detected, it is discriminated that the 276 data is valid signaling data and the 118 consecutive packets of a PID gathered by the slot gatheror are valid MHE packets. Thus, it is possible to verify that the data after modified-data interleaver 125 is identical to the data of MPH Group format after data interleaver. Alternatively, in case where valid TPC data is not detected from the result data obtained by allowing the supposedly 276 signaling data to pass through the PCCC decoder 127, then, on the re-assumption that the 118 consecutive packets of one PID belong an odd-numbered slot instead of an even-numbered slot, the 118 consecutive packets of one PID are allowed to pass through the modified-randomizer 122, the systematic RS encoder 123 and the modified-data interleaver 125 in order again.

The signaling data extractor 126 extracts 276 data (276 bytes) over again from first data in 53th segment, as supposedly signaling data, from an output buffer of the modified-data interleaver 125 shown in FIGS. 6 and 7, on assumption that the data after modified-data interleaver 125 is identical to data of the MPH Group format after data interleaver.

The group format detector 128 discriminates whether or not TPC data is detected from the result data obtained by allowing the supposedly 276 signaling data to pass through the PCCC decoder 127 once more.

When TPC data is detected, the group format detector 128 discriminate that the 118 consecutive packets of a PID are valid MHE packets belonging to an odd-numbered slot, and verify that the modified-data interleaver 125 output data is identical to the data of MPH Group format after data interleaver.

In case where it is discriminated by the group format detector 128 that the 118 consecutive packets of the identical PID are valid slot data, and that the modified-data interleaver 125 output data is identical to data of MPH Group format after data interleaver.

Meanwhile, when either of the results under the assumption that the slot is an even-numbered slot or an odd-numbered slot shows that the TPC data is not detected, the group format detector 128 judges that the 118 packets is erroneous slot data, and then generates an error event.

The mobile stream generating module 130 generates mobile stream data from data of MPH Group format after data interleaver re-configured by an ATSC-MH broadcasting signal re-generating module 120, so that, it is possible to view both main service broadcast and mobile broadcast in the ATSC-MH broadcast receiver 100 of the embodiment of the present invention.

Figure 1:
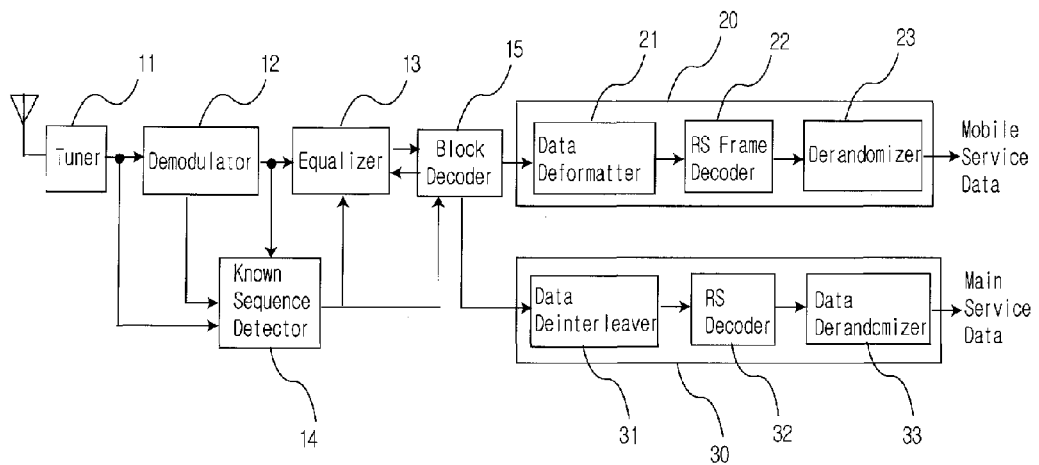
FIG. 1 is a conceptual view illustrating a construction of a conventional ATSC-MH broadcast receiving system.

The mobile stream generating module 130 includes a data deformatter 131, an RS frame decoder 132, a derandomizer 133, which the MPH Group format data sequentially pass through in order, so as to be generated into mobile service data. The data deformatter 131 separates mobile service data and signaling data, and then outputs the separated data. The RS frame decoder 132 performs RS-frame decoding for the mobile service data of the data deformatter 131, and the derandomizer 133 performs derandomizing for the mobile service data, which corresponds to a reverse process of the ATSC-MH transmission system (see also FIG. 1 and ATSC S4-131r14-A153-Part-2-RF-Transmission).

Hereinafter, a description will be given of respective steps for re-generating MPH Group format after data interleaver performed by the ATSC-MH broadcasting signal generating module.

Figure 9:
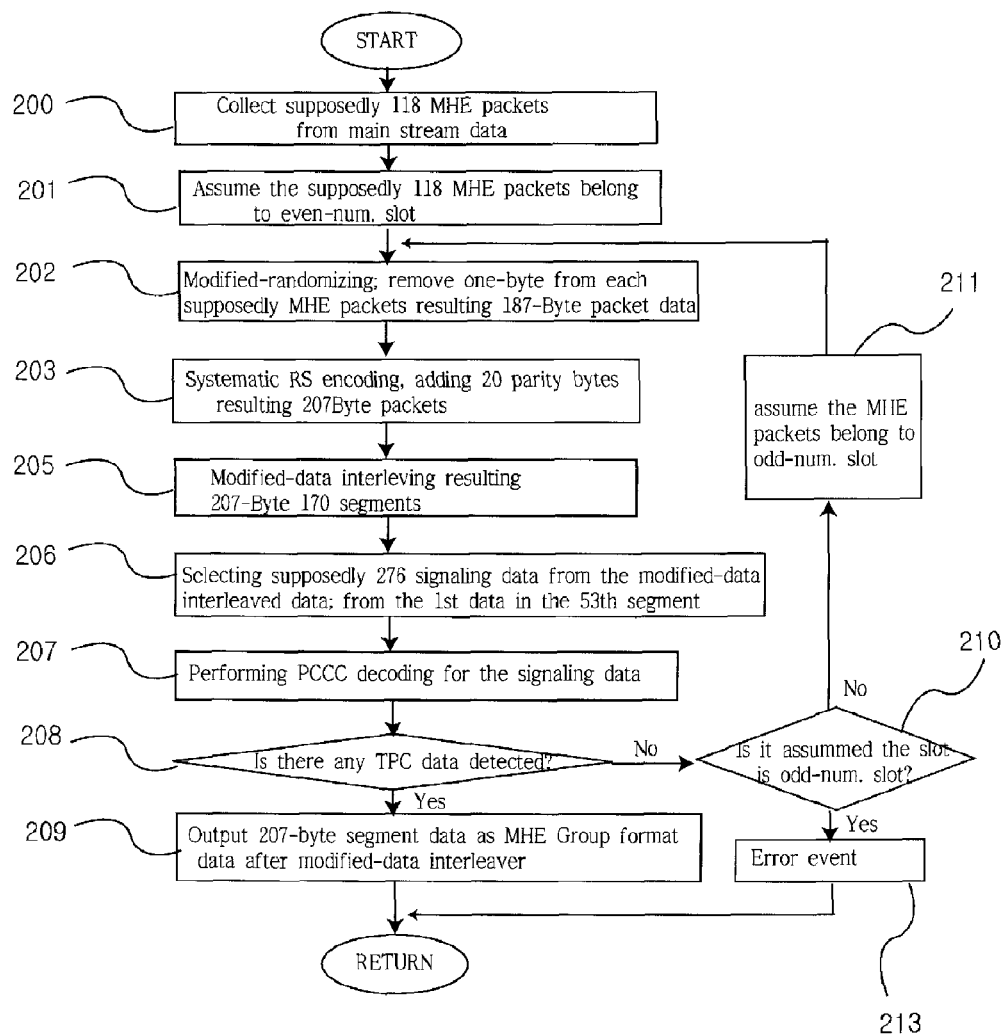
FIG. 9 is a flow chart illustrating respective steps of a method for re-generating an ATSC-MH broadcasting signal in accordance with the embodiment of the present invention.

FIG. 9 is a flow chart illustrating respective steps of a method for re-generating an ATSC-MH broadcasting signal in accordance with the embodiment of the present invention.

A step to be first performed to re-configure data of MPH Group format after data interleaver is to obtain 118 supposedly MHE packets from result data of the conventional ATSC receiving part that receives the ATSC-MH broadcast.

The slot gatheror 121 collects a slot data comprising 118 consecutive packets of an identical PID from 188-byte packet data comprised in the result data (or main stream data), with the proviso that the 118 consecutive packets are normal MHE packets (in step 200). One VSB field is composed of 2 slot-unit data. As described above, since every two slots has offset of 37 consecutive packets, registries of the data processing with respect to odd-numbered slots or even-numbered slots are different from each other. Thus, it is first assumed that the slot including the 118 consecutive packets of a PID is an even-numbered slot (in step 201).

Under the assumption that the slot containing the 118 consecutive packets of a PID is even-numbered, performs modified-randomization, eliminating one sync-byte and randomizing 187-byte for the 188-byte the 118 consecutive packets, so as to generate 187-byte data identical to data after the RS decoder 116 of the main stream data generating module or a conventional ATSC broadcast receiving part, that receives the ATSC-MH broadcasting signal (in step 202).

Then, in a systematic RS-encoding process, 20 parity bytes are added to the 187-byte data after the modified-randomization, and thus 207-byte data is output which identical to data after a data deinterleaver 115 of the main stream data generating module or a conventional ATSC broadcast receiving part that receives the ATSC-MH broadcasting signal (in step 203).

After passing through modified-data interleaving, the 207-byte packet data become 207-byte segment data which identical to data after the trellis decoder 114 of the main stream data generating module or a ATSC broadcast receiving part that receives the ATSC-MH broadcasting signal (in step 205).

276 data from first data in 53th segment are extracted as supposedly signaling data with the proviso that the 207-byte segment data is identical to data of MPH Group format after data interleaver (in step 206).

TPC data is extracted from result data obtained by performing PCCC decoding for the supposedly 276 signaling data. In case when the TPC data is normally detected, it is judged that the 118 consecutive packets of a PID are valid MHE packets and that the slot is an even-numbered slot. Then, the 207-byte segment data is output as data of MPH Group format after data interleaving (in steps 207 and 209).

Meanwhile, when TPC data is not extracted from result data obtained by performing PCCC decoding for the supposedly 276 signaling data, it is re-assumed that the slot containing the 118 consecutive packets of a PID is an odd-numbered slot, and then the 118 consecutive packets of a PID are subjected to modified-randomization, systematic RS-encoding, and modified-data interleaving again (in steps 210 and 211, and steps 201 to 205).

276 data from first data in 53th segment are extracted once more as supposedly signaling data with the proviso that the 207-byte segment data is identical to data of MPH Group format after data interleaver (in step 207).

TPC data is extracted by performing PCCC decoding for the supposedly 276 signaling data. In the case, when TPC data is normally detected, it is judged that the 118 consecutive packets of a PID are valid MHE packets, and that the slot is an odd-numbered slot. Then, the 207-byte segment data is output as data of MPH Group format after data interleaver (in steps 208 and 209).

Meanwhile, when the TPC data is not detected either of the two cases from the 207-byte segment data after the modified-data interleaving, it is judged that 118 consecutive packets of a PID are erroneous MHE packets, and then an error event is generated (in steps, 208, 210, and 213).

In the embodiment of the present invention, data of MPH Group format after data interleaver reconfigured by the ATSC-MH broadcasting signal re-generating module 120 is input to the mobile stream generating module 130, and then the data of MPH Group format after data interleaver is separated into signaling data and mobile service data. After RS frame decoding and data derandomizing processes, mobile service data is output. Therefore, it is possible to view either main service broadcast or mobile broadcast, or to view two broadcasts on one screen at the same time according to selection of receiver's user.

Respective steps of a method for re-generating the ATSC-MH broadcasting signal can be implemented by a computer program, and the computer program can be stored in a storage medium.

On the other hand, the respective steps of the method for re-generating the ATSC-MH broadcasting signal can be implemented in hardware on one, or two or more semiconductor chips. They can also be implemented in various ways according to embodiments, but are not limited to the embodiment.

As described above, although the preferable embodiments of the present invention have been shown and described, it will be appreciated by those skilled in the art that substitutions, modifications and changes may be made in this embodiment without departing from the principles and spirit of the general inventive concept, the scope of which is defined in the appended claims and their equivalents.

INDUSTRIAL APPLICABILITY

The present invention relates to a re-generating method and module for an ATSC-MH broadcasting signal, an ATSC-MH broadcast receiver, and a storage medium which can receive mobile broadcast by reconfiguring an ATSC-MH broadcasting signal from main streams of the conventional ATSC broadcast receiving part.

The invention claimed is:

1. An ATSC-MH broadcasting signal re-generating module comprising:
   a slot gatheror for gathering a slot data comprising 118 consecutive packets of an identical PID supposing valid 118 MHE packets from main stream data generated by a de-randomizer of a main stream data generating module by receiving ATSC-MH RF signal including MHE packets regarded as null packets;
   a modified-randomizer for modified-randomizing the 118 consecutive packets of an identical PID;
   an RS encoder for RS-encoding data after the modified-randomizer;
   a modified-data interleaver for modified-data interleaving data after the RS encoder;
   a signaling data extracting means for extracting signaling data from an output buffer of the modified-data interleaver; and
   a group format detecting means for discriminating whether or not the 118 consecutive packets of an identical PID are enough to be adopted as valid 118 MHE packets according to validity or non-validity of the signaling data, and outputting data of MPH Group format after data interleaver reconfigured from the 118 consecutive packets of an identical PID when the signaling data is valid.

2. The ATSC-MH broadcasting signal re-generating module of claim 1, wherein the signaling data extracting means extracts 276 bytes(276 data) from first data in 53th segment from an output buffer of the modified-data interleaver as the signaling data.

3. The ATSC-MH broadcasting signal re-generating module of claim 1, wherein the group format detecting means extracts TPC data from the result data which is obtained by allowing the signaling data extracted by the signaling data extracting means to pass through a PCCC decoder, and discriminates whether or not the 118 consecutive packets of an identical PID are valid 118 MHE packets according to validity or non-validity of the signaling data.

4. The ATSC-MH broadcasting signal re-generating module of claim 1, wherein the group format detecting means, assuming that a slot containing the 118 consecutive packets of an identical PID is an even-numbered slot, allows the 118 consecutive packets of an identical PID to pass through the modified-randomizer, the RS encoder, and the modified-data interleaver in order, detects validity of the signaling data obtained from the output buffer of the modified-data interleaver, and then discriminates that the slot is an even-numbered slot when a detection result shows that the signaling data is valid;

assuming that the slot containing the 118 consecutive packets of an identical PID is an odd-numbered slot when the detection result shows that the signaling data is not valid, allows the 118 consecutive packets of an identical PID to pass through the modified-randomizer, the RS encoder, and the modified-data interleaver in order again, detects validity of the signaling data obtained from an output buffer of the modified-data interleaver, and then discriminates that the corresponding slot is an odd-numbered slot when this detection result shows that the signaling data is valid; and generates an error event when the signaling data is not valid for either of the two cases.

5. The ATSC-MH broadcasting signal re-generating module of claim 4, wherein the group format detecting means allows the signaling data extracted from either of the output buffer of the modified-data interleaver to pass through the PCCC decoder for discrimination of validity of the signaling data, and judges whether or not the 118 consecutive packets of an identical PID are valid according to detection or non-detection of the TPC data.

6. An ATSC-MH broadcast receiver comprising:
a mobile service signal generating means for generating a mobile service signal by decoding the data of MPH Group format after data interleaver re-configured by the above-described ATSC-MH broadcasting signal re-generating modules, according to claim 1.

7. A method for re-generating an ATSC-MH broadcasting signal comprises;
an MHE packet gathering step of gathering a slot data comprising 118 consecutive MHE packets from main stream data;
an MHE validity judging step of, on an assumption that the slot containing the 118 consecutive MHE packets is an even-numbered slot or an odd-numbered slot, performing modified-randomization, RS-encoding, and modified-data interleaving for the 118 consecutive MHE packets, in order, to form 207-byte segment data, extracting signaling data from an output buffer that outputs the 207-byte segment data after the modified-randomization, and, judging that 118 consecutive MHE packets are valid according to validity or non-validity of the signaling data; and
a group format outputting step of outputting data of MPH Group format after data interleaver which is reconfigured from each times' 118 consecutive MHE packets that are considered to be valid by a result obtained by repeatedly performing each of the two steps in order.

8. The method of claim 7, wherein the MHE validity judging step comprises steps of:
when the signaling data detected on the first assumption is valid, considering the first assumption to be right, and judging that the 118 consecutive MHE packets are valid;
when the signaling data is not valid, performing re-assumption, and performing modified-randomization, RS-encoding, and modified-data interleaving for the 118 consecutive MHE packets, in order again, to form 207-byte segment data, and re-obtaining signaling data, and then, when the re-obtained signaling data is valid, considering the re-assumption to be right and judging that the 118 consecutive MHE packets are valid; and
when the signaling data is not valid for the first assumption and the re-assumption, judging that the 118 consecutive MHE packets are not valid.

9. The method of claim 8, the judgment of validity or non-validity of the signaling data is performed by a step of judging whether or not TPC data is detected by performing PCCC decoding for the signaling data.

10. A non-transitory computer readable storage medium having a computer program embedded therein so as to perform, on a computer, respective steps of the method for re-generating an ATSC-MH broadcasting signal, according to claim 7.

* * * * *